United States Patent [19]

Fukuta et al.

[11] Patent Number: 4,751,482

[45] Date of Patent: Jun. 14, 1988

[54] SEMICONDUCTOR INTEGRATED CIRCUIT DEVICE HAVING A MULTI-LAYERED WIRING BOARD FOR ULTRA HIGH SPEED CONNECTION

[75] Inventors: Masumi Fukuta, Machida; Hisatoshi Narita, Hino, both of Japan

[73] Assignee: Fujitsu Limited, Kanagawa, Japan

[21] Appl. No.: 920,938

[22] Filed: Oct. 20, 1986

Related U.S. Application Data

[63] Continuation of Ser. No. 685,518, Dec. 24, 1984, abandoned.

[30] Foreign Application Priority Data

Dec. 23, 1983 [JP] Japan ............... 58-243410
Dec. 27, 1983 [JP] Japan ............... 58-249336

[51] Int. Cl.$^4$ .................... H05K 5/06; H05K 1/11
[52] U.S. Cl. .................... 333/247; 361/399; 174/525; 357/74
[58] Field of Search ............ 333/247, 246; 357/74, 357/80; 174/52 R, 525; 361/399

[56] References Cited

U.S. PATENT DOCUMENTS

| | | | |
|---|---|---|---|
| 3,155,881 | 11/1964 | St. Jean | 333/247 X |
| 3,218,584 | 11/1965 | Ager | 333/246 |
| 3,303,439 | 2/1967 | Fulp | 333/246 |
| 3,417,294 | 12/1968 | Steidlitz | 333/238 X |
| 3,614,832 | 10/1971 | Chance et al. | 357/74 X |
| 3,786,375 | 1/1974 | Sato et al. | 333/247 X |
| 3,886,505 | 5/1975 | Jacobson | 333/247 |
| 3,895,435 | 7/1975 | Turner et al. | 333/238 X |
| 3,959,874 | 6/1976 | Couconlas | 174/52 PE X |
| 4,096,348 | 6/1978 | Robillard | 174/52 FP |
| 4,276,558 | 6/1981 | Ho et al. | 333/247 X |
| 4,288,760 | 9/1981 | Beyer et al. | 333/238 X |
| 4,460,880 | 7/1984 | Turner | 333/247 X |
| 4,494,083 | 1/1985 | Josefsson et al. | 333/246 X |
| 4,538,170 | 8/1985 | Yerman | 357/80 |
| 4,551,746 | 11/1985 | Gilbert et al. | 357/80 X |
| 4,593,243 | 6/1986 | Lao et al. | 333/33 X |

FOREIGN PATENT DOCUMENTS

| | | |
|---|---|---|
| 0101335 | 2/1984 | European Pat. Off. . |
| 1244257 | 7/1967 | Fed. Rep. of Germany ...... 333/246 |
| 2346924 | 3/1975 | Fed. Rep. of Germany ...... 333/246 |
| 1534329 | 6/1968 | France . |
| 2535110 | 4/1984 | France . |
| 0131851 | 10/1979 | Japan ............... 333/238 |
| 0031042 | 2/1984 | Japan ............... 333/247 |

OTHER PUBLICATIONS

"Microwave Chips for Surface Mounting" *Avantek;* Electronic Engineering, Nov. 1984; p. 124.

Trant, G. R.; "Microwave Stripline Packaging with UMD's"; *Microwave Journal;* Aug. 1975; pp. 49–51.

*Primary Examiner*—Gene Wan
*Assistant Examiner*—Benny Lee
*Attorney, Agent, or Firm*—Armstrong, Nikaido, Marmelstein & Kubovcik

[57] ABSTRACT

This invention relates to an ultra high speed semiconductor integrated circuit device, and in particular to a layout and connecting structure between lead terminals of a package and signal pads on a chip. The device includes a wiring board, positioned above the chip, which comprises an internal transmission line having a predetermined characteristic impedance on a dielectric insulating plate. The internal transmission line forms a strip line or coplanar transmission line including a signal line an ground conductor film. The wiring board internconnects the outer lead and bonding pads on the chip. The wiring between the internal transmission lines can cross by using a multi-layered structure. As the result of the structure of the present invention, transmission loss is reduced, and it is possible to design the wiring board having an optimum performance for ultra high speed operation of the high density integrated circuit device.

7 Claims, 5 Drawing Sheets

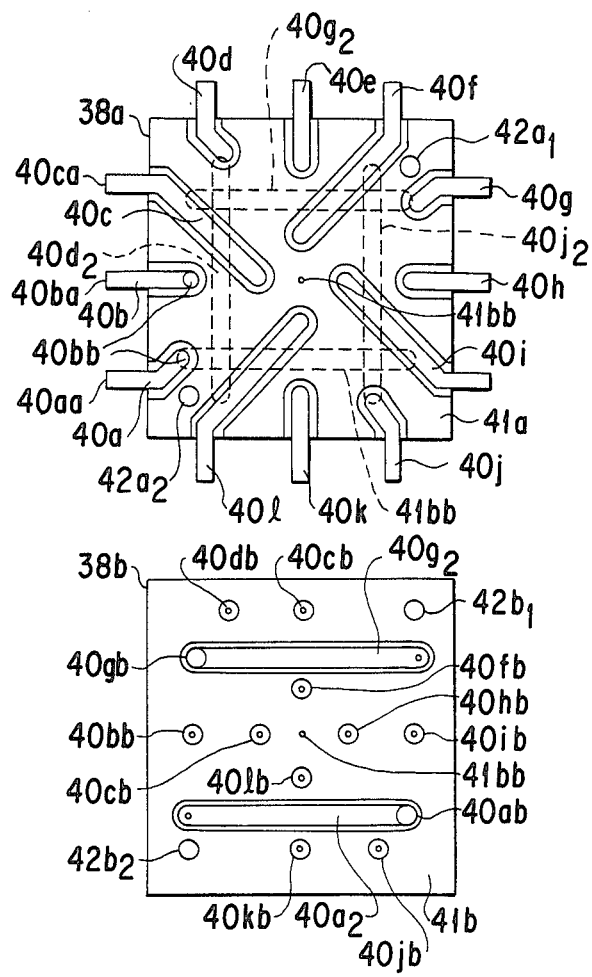
FIG. 10B
FIG. 10C
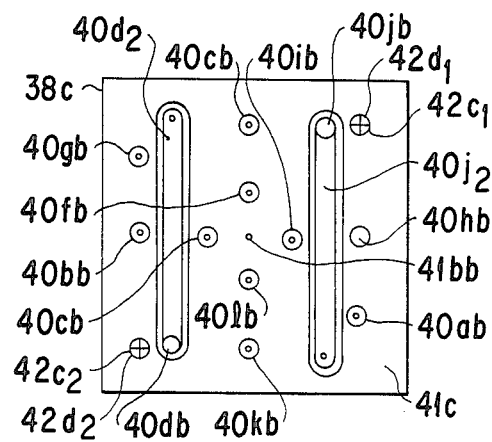
FIG. 10D

SEMICONDUCTOR INTEGRATED CIRCUIT DEVICE HAVING A MULTI-LAYERED WIRING BOARD FOR ULTRA HIGH SPEED CONNECTION

This application is a continuation of application Ser. No. 685,518 filed 12/24/84, now abandoned.

BACKGROUND OF THE INVENTION

1. Field of the Invention

This invention relates to a semiconductor integrated circuit device, and in particular, it is related to a layout and connecting structure between inner lead terminals of the package and bonding pads on a chip for an ultra high speed semiconductor integrated circuit device of a speed greater than 100 Gigabit/sec.

2. Description of the Prior Art

As the scale of integration of the semiconductor device has increased, improving of the efficiency and the processing speed of the device has become important. In the field of the ultra high speed semiconductor IC devices, gallium arsenide (GaAs) is used widely for practical use, since its carrier mobility is larger than that of silicon. It has been reported that GaAs semiconductor devices have operated at more than 10 Gigabit/sec (G bit/s) without difficulty, but it is still difficult to operate the GaAs IC devices at 100 G bit/s.

On the other hand, as the scale of integration of semiconductor devices has increased, interconnection wiring between elements has become complicated, and it has become a serious problem to be solved in an ultra high speed IC device.

In order to more clearly understand the advantage of the present invention, the prior art wiring of a semiconductor device will be described briefly. FIG. 1 illustrates schematically a cross-sectional view of a prior art structure of an exemplary semiconductor IC device. FIG. 2 illustrates schematically a cross-sectional view of a multilead IC device which has a wiring board. FIG. 3A is a schematic cross-sectional view of a prior art wiring board corresponding to FIG. 2. FIG. 3B illustrates schematically a bottom plan view of the conventional structure of a wiring board corresponding to FIG. 3A.

In the figures, reference numerals 1 and 11 are the package, 2 and 12 are the semiconductor chips mounted in the package, 3 and 13 are outer leads, 4 and 14 are inner lead terminals connected to the outer leads, 5 and 15 are bonding pads, and 6 and 19 are inner leads connected between the bonding pads 5 or 15 and the inner lead terminal 4 or 14 of the package. 7 and 17 are cover plates which cover the package 1 or 11. 16 is a wiring board which includes a dielectric plate 18, a positioning mark 18a, signal lines 19 and 19a, signal line terminal 19aa, and a projection lead 19ab for bonding to the chip 2 or 12 (see FIGS. 3A, 3B). 50 is a cavity, 60 is a low melting point metal sheet to bond the chip, and 70 is a hermetic seal.

In a conventional GaAs IC device, as shown in the FIGS. 1 through 3, a GaAs substrate chip 2 or 12 is bonded by the low melting point metal sheet 60 in the cavity 50 of the ceramic package 1 or 11. Each of the bonding pads 5 or 15 on the chip 2 or 12, have the inner leads 6 or 19 respectively interconnected to the outer leads 3 or 13 through the inner lead terminals 4 or 14. A wiring board 16 is provided with a printed wiring circuit to connect the wiring line between the bonding pad 15 and the outer leads 13. The wiring board 16 is arranged above the chip 12. The chip size is approximately 4 mm square for example. The package 1 or 11 is sealed hermetically to the cover plate 7 or 17 respectively by a seal 70.

As the integration scale of the semiconductor device has increased, the wiring between the chip 2 and outer lead 3 has become more complicated. Applying the wiring board of the prior art as shown in FIG. 2, the wiring of the device is simplified. In most of the prior art devices, a multi-lead package having a wiring board 16 is used such as shown in FIG. 2.

A study of currently available IC packages has developed the performance characteristics for GaAs ICs operating at ultra high speed. When the operation speed is increased up to an ultra high speed operation of approximately 100 G bit/s, the conventionally structured device has disadvantages, such as large reflection and attenuation of the signal on its transmission lines in the package. Accordingly, it is necessary to reduce transmission loss, and the reflection and attenuation of the signal on the inner leads 6 and 19 which are connected between the outer leads 3 or 13 and bonding pads 5 or 15 respectively.

SUMMARY OF THE INVENTION

It is the object of the present invention to provide an improved ultra high speed semiconductor IC device.

Another object of the present invention is to provide a structure for an ultra high speed semiconductor IC package which can improve the operating speed of the device.

A further object of the present invention is to provide a wiring board which can reduce the reflection and transmission line loss in the ultra high speed operation.

The foregoing objects are accomplished by designing a wiring board using ultra high speed transmission line technology. By doing so, it is possible to design the layout of the wiring board in order to get optimum performance for the ultra high speed operation.

The above objects are a accomplished by forming wiring boards in the form of a coplanar guide or a strip line structure for the ultra high speed transmission line. The multi-layer wiring board can be formed by using a through hole connection. By using such a configuration the output pads of the semiconductor chip can be positioned at any point on the chip.

Using high frequency technology of coplanar guides, strip lines, impedance matching resistors and wave reforming circuit elements, it is possible to design the multi-layered wiring board. It is possible to reduce the reflection and attenuation of a signal resulting from the inner lead, and it is possible to design a wiring board having optimum performance for ultra high speed operation.

These and other objects will become apparent from the following detailed description taken in connection with the accompanying drawings.

BRIEF DESCRIPTION OF THE DRAWINGS

FIG. 10B illustrates schematically a plan view of the structure of an upper part of a wiring board corresponding to FIG. 10A.

FIG. 10C illustrates schematically a plan view of the structure of an intermediary wiring board corresponding to FIG. 10A.

FIG. 10D illustrates schematically a plan view of the structure of a bottom part of a wiring board corresponding to FIG. 10A.

The same or like reference numerals denote the same or like parts throughout the drawings.

DETAILED DESCRIPTION OF PREFERRED EMBODIMENTS

The preferred embodiment of the present invention will be explained with reference to the accompanying drawings.

Figure 4:
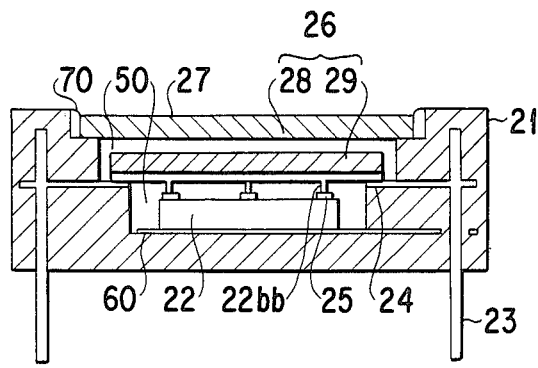
FIG. 4 illustrates schematically a cross-sectional view of an improved ultra high speed semiconductor IC device of a first embodiment of the present invention.
Figure 5A:
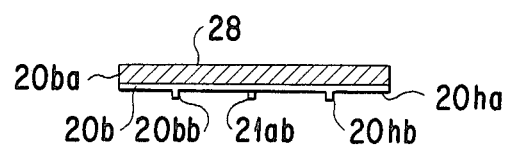
FIG. 5A illustrates schematically a cross-sectional view of a first embodiment of an improved structure of a wiring board corresponding to FIG. 4.
Figure 5B:
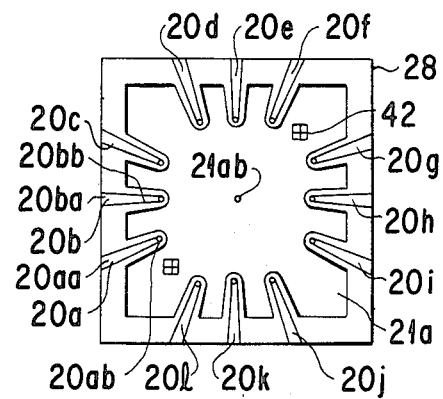
FIG. 5B illustrates schematically a bottom plan view of the improved structure of a wiring board corresponding to FIG. 5A.

FIG. 4 illustrates schematically a cross-sectional view of an improved ultra high speed semiconductor IC device of a first embodiment of the present invention. FIG. 5A ilustrates schematically a cross-sectional view of an improved structure of a wiring board corresponding to FIG. 4, and FIG. 5B illustrates schematically a bottom plan view of the improved structure of a wiring board corresponding to FIG. 5A.

As shown in FIG. 4, the IC chip 22 is mounted in the cavity 50 of ceramic package 21 by a low melting point metal sheet 60. Each of the pads 25 on the chip 22 is respectively bonded to a projection lead 22bb and interconnected by a signal line 29 to the outer leads 23 through the inner lead terminals 24 of the package 21. A wiring board 26 comprises a sapphire plate, and is positioned above the chip 22. The spacing between the bottom of the wiring board 26 and the surface of the chip 22 is formed at a distance of 30 μm to 50 μm. The chip 22 is grounded to a grounded outer lead (not shown) by the low melting point metal layer 60. The chip size is, for example, approximately 4 mm square. The pads 25 are connected to each of the projection leads of the signal lines which are made of gold, and the bonding connection is formed by the ball bonding method using a technology such as flip tip bonding for example, of the prior art. Detailed structure of the signal line will be described with respect to FIG. 5. The spacing is a critical factor, and it must be uniform in order to maintain the characteristic impedance of the internal transmission line constant and reduce the reflection of the signal. The package 21 is hermetically sealed to cover plate 27 by a seal 70.

The technique to form the device of FIG. 4 uses elementary processes of semiconductor device fabrication such as bonding, metal sputtering, mounting technology, etc., which are conventional in the art.

Figure 1:
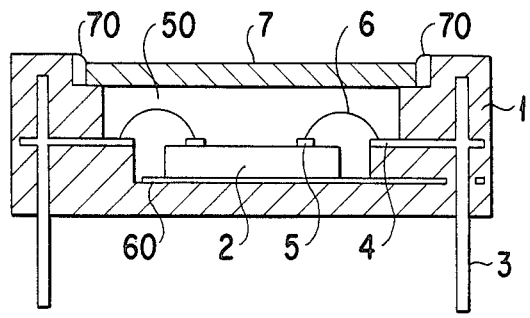
FIG. 1 illustrates schematically a cross-sectional view of the structure of a semiconductor IC device of the prior art.
Figure 2:
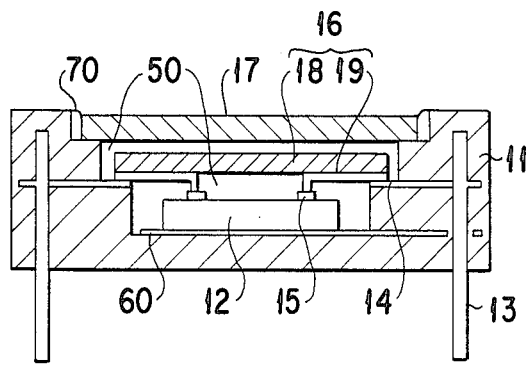
FIG. 2 illustrates schematically a cross-sectional view of the structure of a multi-lead IC device of the prior art.
Figure 3A:
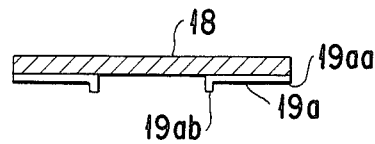
FIG. 3A illustrates schematically a cross-sectional view of a conventional structure of a wiring board corresponding to FIG. 2.
Figure 3B:
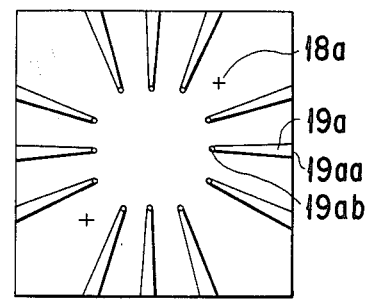
FIG. 3B illustrates schematically a bottom plan view of a conventional structure of a wiring board corresponding to FIG. 3A.

The structure of the device of the present invention has a significant difference when compared to a prior art device. The wiring board 26 in FIG. 4 has a coplanar guide when compared to that of FIG. 2. In the wiring board 26 having the coplanar guide, the signal on the pad 25 is transferred to the outer lead 23 through the internal transmission lines 29 without transmission loss. The coplanar guide is shown in FIG. 5B to better illustrate the construction thereof.

Referring to FIGS. 5A and 5B, the wiring board 26 is made of sapphire plate 28, for example. The signal lines 20a to 20l are a metallic conductor pattern of gold, silver, copper, etc., which are formed on the bottom of sapphire plate 28. These signal lines 20a, 20b, . . . and 20l, as shown in FIG. 5B, are shielded by the grounded conductor 21a. By adapting the coplanar guide structure to the wiring board, it is possible to reduce the signal reflection and the attenuation of the internal transmission lines in the ultra high speed IC device. The tip of each of the signal lines is provided with projection leads 20ab, 20bb, . . . and 20lb, and the other end of the signal lines are provided with signal line terminals 20aa, 20ba, . . . and 20la. Each of the projection leads and the signal lines is bonded to the pads 25 or inner lead terminals 24.

Figure 6A:
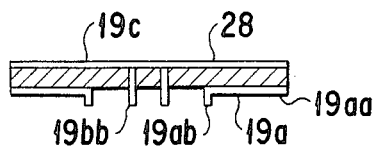
FIG. 6A illustrates schematically a cross-sectional view of a second embodiment of an improved structure of a wiring board corresponding to FIG. 4.
Figure 6B:
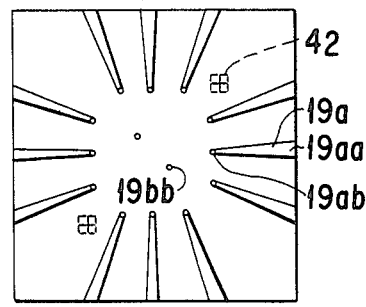
FIG. 6B illustrates schematically a bottom plan view of the second embodiment of the improved structure of a wiring board corresponding to FIG. 6A.
Figure 7A:
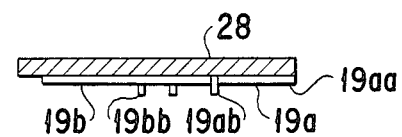
FIG. 7A illustrates schematically a cross-sectional view of a third embodiment of an improved structure of a wiring board corresponding to FIG. 4.
Figure 7B:
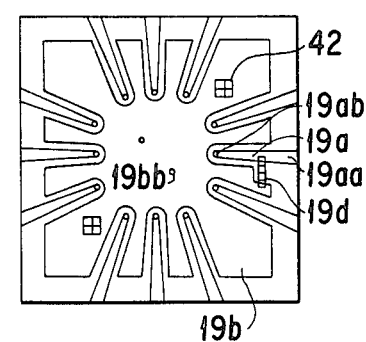
FIG. 7B illustrates schematically a bottom plan view of the third embodiment of the improved structure of a wiring board corresponding to FIG. 7A.
Figure 8A:
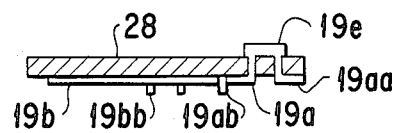
FIG. 8A illustrates schematically a cross-sectional view of a fourth embodiment of an improved structure of a wiring board corresponding to FIG. 4.
Figure 8B:
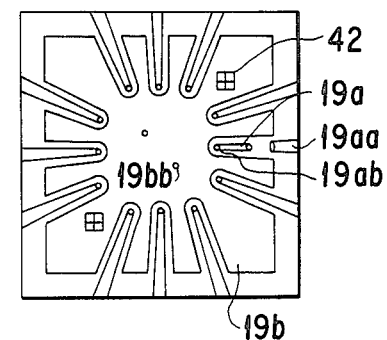
FIG. 8B illustrates schematically a bottom plan view of the fourth embodiment of the improved structure of a wiring board corresponding to FIG. 8A.

FIGS. 6A, 7A, and 8A illustrate schematically a cross-sectional views of alternate embodiments of the structure of a wiring board corresponding to FIG. 5A respectively, and each of FIGS. 6B, 7B, and 8B illustrates schematically a bottom plan view of the alternate embodiments of the structure of a wiring board corresponding to FIG. 5B respectively.

Referring to FIGS. 6A and 6B, the wiring board 28 has a strip line 19a. Compared to that of FIGS. 5A and 5B, the grounded conductor 19c is formed on the upper surface of the wiring board 28, and the grounded conductor is grounded by the projection lead 19bb. The wiring board 28 comprises a plurality of signal lines having a strip shape, among which only 19a is designated in the figure. Each of these strip lines comprises a strip line structured internal transmission line together with a ground conductor 19c. For a further description of the strip line, commonly known as a waveguide, reference is made to a report titled "Microwave Integrated Circuits" by Gupta, K. C. and Singh, A. in John Wiley & Sons (1974). This report discloses a strip line of the same principle as the strip line on the present invention. According to the report, a optimum value of an impedance of a strip line is defined by the dielectric constant of an insulator, thickness of the insulator and width of the strip line. Therefore, in order to have an optimum value of the impedance $Z_0$ of the device, for example $Z_0$ is to be 50 ohm, the optimum value of the impedance $Z_0$ can be selected from the ratio W/h=0.9, where W is the width of strip line, h is the thickness of the sapphire plate (specific inductive capacity of sapphire $\epsilon_r$ is 10.55). As a result, the thickness of the sapphire plate 28 is chosen to be approximately 0.1 mm, and the width of the strip line is selected to be 0.09 mm. Thus, the signals on the projection lead 19ab are transferred to the signal line terminal 19aa through the signal lines 19a without transmission loss.

FIGS. 7A and 7B illustrate still another type of wiring board 28, having an impedance matching resistor 19d. Essentially all semiconductor devices and particularly those intended for operation at high frequency, require a suitable impedance matching to the output circuits in order to provide enough output power. The impedance matching between package leads is also important to the reflection of the signal through the signal lines. With any output device, the power output varies as the load impedance is varied. In the wiring board 28, having the signal line 19a with the impedance matching resistor 19d shunt to ground for example, the output impedance of the device is matched to the load which may be 50 ohms, for example, by the matching resistor 19d. Thus, the signals on the projection lead 19ab are transferred to the signal terminal 19aa through the signal lines 19a without transmission loss.

In the wiring board 28 of FIGS. 8A and 8B, the wiring board 28 has a circuit element 19e for wave reforming. The wave reforming circuit 19e is mounted on the upper surface of sapphire plate 28, which is connected in series to the signal lines 19a and 19aa. Occasionally, semiconductor devices intended for operation at ultra high frequency are required for the wave reforming circuit 19e. In order to reform nonlinear distortion of the signal, for example, the signal on the strip line is compensated for the transmission loss by the wave reforming circuit 19e which is used in an IC. Similarly, resistors, capacitors and other components for the IC can be stacked to produce increased or decreased impedance, increased output, etc. The desired relationship of the device is directly proportional to input signal waveform and that of the output. Using the wiring board 28 having the wave reforming circuit 19e, for example, the signals on the projection lead 19ab are reformed and the distortion is reduced.

Figure 9:
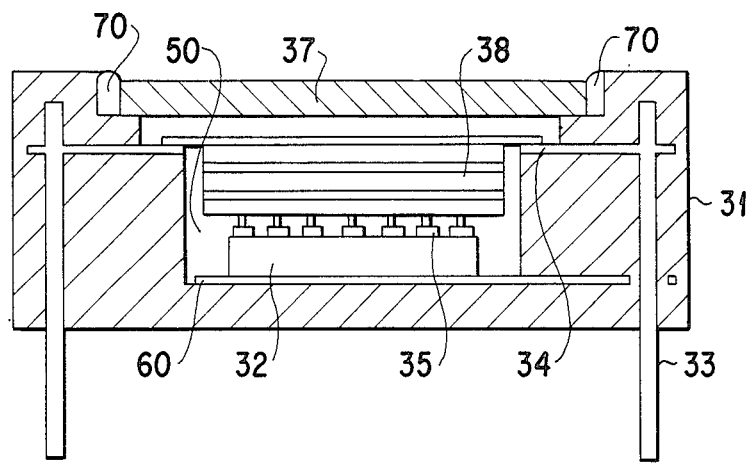
FIG. 9 illustrates schematically a cross-sectional view of an improved ultra high speed semiconductor IC device of a second embodiment of the present invention.

FIGS. 9 through 10D illustrate another embodiment of the present invention which has a multi-layered wiring board.

FIG. 9 illustrates schematically a cross-sectional view of an improved ultra high speed semiconductor IC device of a second embodiment of the present invention. A wiring board 38 has a multi-layered structure rather than the single layer structure of FIG. 4. As the scale of the IC device increases, the wiring of the chip has become more complicated, and by using a multi-layered wiring board, the wiring chip is simplified. Thus, the scale of the integration of the semiconductor device can be increased because it is possible to reduce the connecting area of the circuit element chip.

Figure 10A:
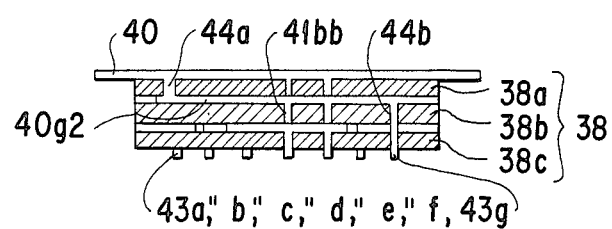
FIG. 10A illustrates schematically a cross-sectional view of an improved structure of a multi-layered wiring board corresponding to FIG. 9.

FIG. 10A illustrates schematically a cross-sectional view of a multi-layered wiring board corresponding to FIG. 9. The multi-layered wiring board 38 comprises multi-layered insulating plates 38a, 38b, and 38c which are made of sapphire plates, for example. This embodiment shows a three layered wiring board as an example. It will be obvious that any number of layers can be used. Each of the sapphire plates 38a, 38b, and 38i c have a patterned metallic conductor plane film formed thereon which is made of gold, silver, copper, etc. The signal lines $40g_2$ and the grounding conductors 41bb are formed respectively on the sapphire plates 38a, 38b, and 38c. The patterned sapphire plates 38a, 38b, and 38i c are stacked and fused to form the multi-layered wiring board 38. The stacked board 38 includes a signal line terminal 40, and projection leads 43a, 43b, ... and 43g which extend through holes to the connection leads 44a and 44b.

FIG. 10B shows schematically a plan view of the upper surface of wiring board 38a shown in FIG. 10A. The patterned metallic film of the wiring board 38a is used for the signal lines 40a, 40b, ... and 40l which has the signal line terminal leads 40aa, 40ba, ... and 40la respectively. Each of the signal line terminal leads 40aa, 40ba, ... and 40la projects out from the wiring board 38a as shown, and is connected to the respective inner lead terminals 34 of the package 31. The inner lead terminals 34 are connected to the outer leads 33 respectively. The dotted lines $40a_2$, $4g_2$, and $40d_2$, $40j_2$ designate the signal lines on the wiring board 38b and 38i c which are shown in FIGS. 10C and 10D respectively. The wiring board 38a includes the through holes $42a_1$ and $42a_2$ in order to observe the positioning mark (+) on the chip.

FIG. 10C illustrates schematically a plan view of the wiring pattern on the intermediate wiring board 38b shown in FIG. 10A. The wiring board 38b is made of a sapphire plate the upper surface of which is coated with a metallic film patterned as described in FIG. 5. The metallic pattern in this example includes a ground potential metallic conductor 41b and strip signal lines $40a_2$ and $40g_2$. The wiring board 38b includes the through holes $42b_1$ and $42b_2$ in order to observe the positioning mark (+) on the chip. Each end point of the signal lines $40a_2$ and $40g_2$ is provided with projection leads extending through connecting holes 40ab and 40gb. Moreover, the wiring board 38b further includes the through holes 40bb, 40cb, ... and 40lb which are used to interconnect between the upper board and lower board using the through hole connection. The grounded conductors 41b are connected by a grounding line 41bb passing through the through hole.

FIG. 10D illustrates schematically a plan view of the pattern on the wiring board 38c shown in FIG. 10A. The pattern and materials of the wiring board 38c are similar to that of the wiring board 38b shown in FIG. 10C. It includes signal lines $40d_2$ and $40j_2$, projection lead connecting holes 40ab, 40bb, ... and 40lb, ground conductor 41c, and through holes $42c_1$, $42c_2$.

According to the present invention above described, in order to observe positioning mark (+) $42d_1$ and $42d_2$ on the chip, each of the sapphire plates 38a, 38b, and 38c has small see-through holes. Checking the positioning mark (+), the multi-layered wiring boards are mounted in a position above the upper surface of the chip.

The connection from the upper wiring board 38a to the lower wiring board 38c is formed by a through hole connection. For example, the signal line 40a positioned on the upper wiring board 38a is connected to the signal line $40a_2$ on the intermediate board 38b by the projection lead 44a (shown in FIG. 10A) by through hole connection 40bb. Similarly, the signal line 40a₂ (shown in FIG. 10C) is connected to the projection lead 44b (shown in FIG. 10A) through the projection lead hole 40ab. Finally, the projection lead 43g (shown in FIG. 10A) is interconnected to the bonding pad. Similarly, the connections between the sapphire plate 38c and the bonding pads are accomplished by the projecting leads 43a, 43b, . . . and 43g (shown in FIG. 10A) which pass through the projection lead holes 40ab, 40hb, 40jb, 40kb, 40db, 40gb, and 40bb. Furthermore, wiring between the signal lines is possible by crossing the lines, and the output pads 35 can be set on any position on the chip 32. Therefore, it is possible to reduce the connecting area between circuit elements on the chip so that the scale of the integration of the semiconductor device can be increased. As the result, it is possible to design a wiring board having optimum performance for the ultra high speed operation of a high density integrated circuit device. For example, using a multi-layered wiring board of the present invention, a performance of approximately 100 G bit/s has been attained.

Although only the ultra high speed GaAs semiconductor embodiment of the invention has been disclosed and described, it is apparent that other embodiments and modifications of the invention are possible.

It is readily apparent that the above-described semiconductor integrated circuit device having a multi-layerd wiring board for ultra high speed meets all of the object mentioned above and also has the advantage of wide commerical utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

We claim:

1. A semiconductor integrated circuit device comprising:
   package means;
   a semiconductor chip having at least an output terminal and being mounted in said package means;
   at least an outer lead extending from said package means; and
   a wiring board mounted on said package means in opposing relationship to said semiconductor chip to seal said semiconductor chip therein, said wiring board comprising at least one dielectric plate and an internal transmission line fabricated on said dielectric plate, said internal transmission line comprising at least one ground conductor and at least one signal line spaced from said ground conductor, wherein said internal transmission line has a predetermined characteristic impedance determined by the width of said signal line, the dielectric constant of said dielectric plate, and the spacing between said signal line and said ground conductor, and wherein said internal transmission line extends over said semiconductor chip, and the signal line has at least a projection which directly interconnects said output terminal of said semiconductor chip and said outer lead.

2. A semiconductor integrated circuit device according to claim 1, wherein said internal transmission line is a coplanar guide, having said signal line and said ground conductor formed on a common surface of said dielectric plate.

3. A semiconductor integrated circuit device according to claim 1, wherein said internal transmission line is a strip line structure having said signal line formed on a surface of said dielectric plate opposing said semiconductor chip and said ground conductor formed on a surface of said dielectric plate remote from said semiconductor chip.

4. A semiconductor integrated circuit device according to claim 3, wherein said internal transmission line includes an impedance matching resistor mounted on said dielectric plate, and connected between said signal line and said ground conductor.

5. A semiconductor integrated circuit device according to claim 1, wherein said wiring board comprises a multi-layered wiring board.

6. A semiconductor integrated circuit device according to claim 5, wherein said multi-layered wiring board comprises plural dielectric plates with signal lines and ground conductors on each of said plates, and wherein said signal lines on said plates are interconnected with signal lines on said other plates through holes formed in each of said dielectric plates.

7. A semiconductor integrated circuit device comprising:
   package means;
   a semiconductor chip having at least an output terminal and being mounted in said package means;
   at least an outer lead extending from said package means; and
   a wiring board mounted on said package means in opposing relationship to said semiconductor chip said wiring board comprising a dielectric plate and an internal transmission line fabricated on said dielectric plate, said internal transmission line comprising a ground conductor and a signal line spaced from said ground conductor, wherein said internal transmission line has a predetermined characteristic impedance determined by the width of said signal line, the dielectric constant of said dielectric plate, and the spacing between said signal line and said ground conductor, and wherein said internal transmission line extends over said semiconductor chip, and the signal line directly interconnects said output terminal of said semiconductor chip and said outer lead;
   wherein said internal transmission line is a strip line structure having said signal line formed on a surface of said dielectric plate opposing said semiconductor chip and said ground conductor formed on a surface of said dielectric plate remote from said semiconductor chip, and
   wherein said internal transmission line includes a wave reforming circuit mounted on said remote surface of said dielectric plate and connected through a hole in said dielectric plate and coupled in series to said signal line.

* * * * *